(12) United States Patent
Lin et al.

(10) Patent No.: US 8,704,317 B2
(45) Date of Patent: Apr. 22, 2014

(54) MICROSTRUCTURE DEVICE WITH AN IMPROVED ANCHOR

(71) Applicant: Taiwan Semiconductor Manufacturing Company, Ltd., Hsin-Chu (TW)

(72) Inventors: Chung-Hsien Lin, Hsinchu (TW); Chun-Wen Cheng, Zhubei (TW); Chia-Hua Chu, Zhubei (TW); Yi Heng Tsai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/721,734

(22) Filed: Dec. 20, 2012

(65) Prior Publication Data
US 2013/0126989 A1 May 23, 2013

Related U.S. Application Data

(62) Division of application No. 12/858,202, filed on Aug. 17, 2010, now Pat. No. 8,343,789.

(51) Int. Cl.
*H01L 29/84* (2006.01)

(52) U.S. Cl.
USPC .......................................... 257/415

(58) Field of Classification Search
CPC ............ H01L 2924/1461; H01L 29/84; B81B 7/0003; B81B 7/0032; B81B 7/0048; B81C 1/00269; B81C 1/00134; B81C 1/0023; B81C 1/00238; B81C 2203/01; B81C 2203/0154
USPC .................. 257/414–415; 381/175
See application file for complete search history.

(56) References Cited

U.S. PATENT DOCUMENTS

| | | | |
|---|---|---|---|
| 6,541,834 B1 | 4/2003 | Shie et al. | |
| 7,074,635 B2 | 7/2006 | Kim et al. | |
| 7,352,040 B2 | 4/2008 | Partridge et al. | |
| 7,625,773 B2 | 12/2009 | Lutz et al. | |
| 7,626,258 B2 | 12/2009 | Lim et al. | |
| 7,745,308 B2 | 6/2010 | Lee et al. | |
| 8,039,910 B2 | 10/2011 | Yen et al. | |
| 8,154,092 B2 | 4/2012 | Melzak et al. | |
| 8,217,474 B2 | 7/2012 | Lee et al. | |
| 8,240,205 B2 | 8/2012 | Morii | |
| 2005/0156260 A1* | 7/2005 | Partridge et al. | 257/414 |
| 2005/0280106 A1* | 12/2005 | Kim et al. | 257/414 |
| 2006/0180882 A1 | 8/2006 | Sato et al. | |
| 2006/0270088 A1 | 11/2006 | Fischer et al. | |
| 2007/0252224 A1* | 11/2007 | Barlocchi et al. | 257/414 |
| 2008/0119003 A1* | 5/2008 | Grosjean et al. | 438/50 |
| 2008/0308884 A1* | 12/2008 | Kalvesten | 257/414 |

* cited by examiner

*Primary Examiner* — Nathan Ha
(74) *Attorney, Agent, or Firm* — Haynes and Boone, LLP

(57) ABSTRACT

A microelectromechanical system (MEMS) device includes a substrate and an oxide layer formed on the substrate. A cavity is etched in the oxide layer. A microstructure device layer is bonded to the oxide layer, over the cavity. The microstructure device layer includes a substantially solid microstructure MEMS device formed in the microstructure device layer and suspended over a portion of the cavity. An anchor is formed in the device layer and configured to support the microstructure device, the anchor having an undercut in the oxide layer. The undercut has a length along the anchor that is less than one-half a length of an outer boundary dimension of the microstructure MEMS device.

20 Claims, 10 Drawing Sheets

MICROSTRUCTURE DEVICE WITH AN IMPROVED ANCHOR

This patent application is a divisional application of U.S. Ser. No. 12/858,202, filed Aug. 17, 2010, now U.S. Pat. No. 8,343,789 issued Jan. 1, 2013, the disclosure of which is hereby incorporated by reference.

BACKGROUND

The present disclosure relates generally to semiconductor manufacturing. Specifically, the present disclosure relates to fabricating a microstructure device with an improved anchor having a reduced undercut.

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Microelectromechanical systems (MEMS) devices are very small electro-mechanical systems incorporated into semiconductor IC circuits. One example of a MEMS device is a micro-inertial sensor/accelerometer. Conventional silicon on insulator (SOI) type MEMS devices are fabricated using a buried oxide layer as a sacrificial material layer. As such, a portion of the oxide layer is removed at a later stage of fabrication to release the MEMS device. Generally, the amount of oxide to be removed is time controlled where the etch time depends on the physical dimensions of the MEMS device. Because the oxide etches uniformly, the oxide is removed both from under the MEMS device and laterally from under supporting structure, such as the anchor. This causes an undercut problem for the anchor, which can weaken the anchor. The etching is usually performed from outside edges of the MEMS device and thus, the undercut of the anchor is approximately half of the dimension of the MEMS device. The undercut reduces strength of the anchor. To combat this large undercut problem, designers may perform an etch process of the oxide layer through the MEMS device using a number of release holes/trenches through the MEMS device to allow the etchant to etch the oxide layer beneath the MEMS device more quickly by etching from multiple areas. However, this type of etching compromises the MEMS device by limiting device design flexibility and degrading device performance (e.g., reducing total mass of a MEMS accelerometer).

Therefore, what is needed is a system of fabricating a microstructure device with an improved anchor.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
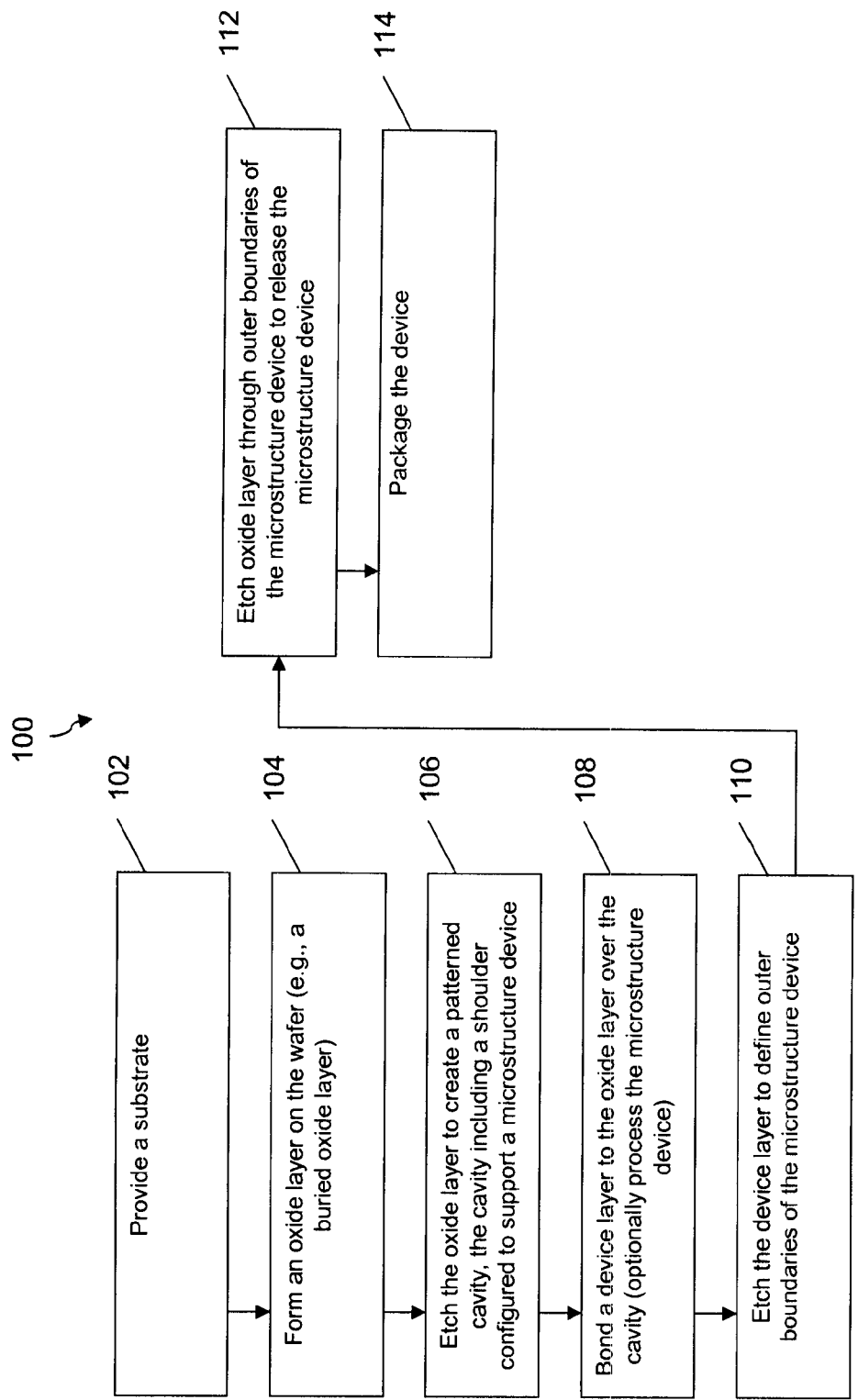
FIG. 1 is a flow chart illustrating an embodiment of a method of fabricating a microstructure device with an improved anchor.

The present disclosure relates generally to semiconductor manufacturing. Specifically, the present disclosure relates to a system of fabricating a microstructure device with an improved anchor. In an embodiment, the present disclosure provides a microelectromechanical system (MEMS) microstructure semiconductor device, such as a micro-inertial/accelerometer sensor. In one embodiment, the present disclosure provides a complementary metal oxide semiconductor (CMOS) chip having reduced undercut for the anchor. Using the methods described herein the device's operating characteristics and physical structure are enhanced with respect to traditional devices.

It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer includes embodiments where the first and second layer are in direct contact and those where one or more layers are interposing the first and second layer. The present disclosure refers to MEMS devices; however, one of ordinary skill in the art will find other applicable technologies that may benefit from the disclosure such as, nanoelectromechanical systems (NEMS) devices, application specific integrated circuit (ASIC) devices, and other such devices. Furthermore, the MEMS device structure or design illustrated is exemplary only and not intended to be limiting in any manner.

FIG. 1 is a flow chart illustrating an embodiment of a method 100 of fabricating a microstructure device with an improved anchor. Cross-sectional views of different embodiments of such microstructure devices are shown in FIGS. 2-10 at stages of fabrication. The present disclosure is described herein with respect to embodiments shown in FIGS. 2-10 relating to the method 100 provided in FIG. 1. The method 100 provides for a microstructure semiconductor fabrication process. One of ordinary skill in the art would recognize additional steps that may be included in the method 100 and/or omitted from the method 100. The method 100 and the corresponding FIGS. 2-10 are exemplary only and not intended to be limiting. For example, the structure of the MEMS devices depicted in the figures are exemplary only and similar methods may be used to form other devices. CMOS circuitry may be included in the devices depicted in FIGS. 2-10.

Accordingly, as should be understood by those having ordinary skill in the art, the present disclosure provides embodiments of a microstructure device (e.g., a microelectromechanical systems (MEMS) device) without release holes through the microstructure device and with a shorter undercut under the anchor. In an embodiment, a buried insulating isolation layer is patterned and etched to form a cavity. The size and shape of the cavity includes cavity walls under a device layer, in which a microstructure device is formed. Then, in a subsequent release etch process for releasing the microstructure device, an etch process simply needs to etch away the walls of the cavity (and optional pillars), which support the microstructure device, instead of having to etch a bulk film under the entire microstructure device. Thus, the etching process is a shorter time period. In other words, because the oxide layer etch process etches the oxide layer uniformly as long as the etchant is present, the oxide under both the anchor and the microstructure device is etched away. For example, if etchant etches the oxide layer from a perimeter of the microstructure device, the etchant conventionally etches inward and outward the same distance under the anchor as under the microstructure. If etchant is applied from opposite sides of the microstructure device, the etched undercut under the anchor is one-half the distance of the length of the microstructure device (because the etching under the microstructure device comes from multiple sides). Therefore, if a shorter etch period is used because only the cavity walls (and optionally pillars) need to be etched to release the microstructure device, there is less etching time to etch an undercut under the anchor. As a result, the undercut under the anchor is reduced. As should also be understood, a microstructure device having a small undercut creates a larger, stronger anchor for the microstructure device.

FIGS. 2-6 are cross-sectional views illustrating an embodiment of a microstructure device 200 according to the method 100 of FIG. 1 at various stages of fabrication. The method 100 begins at block 102 where a substrate 201 (FIG. 2) is provided.

In an embodiment, the substrate 202 is an undoped silicon (Si), high resistance, substrate of any thickness. In an embodiment, the substrate 202 has an approximate resistivity >3000 Ohm-cm. In an embodiment, the substrate 202 may include a bonded silicon on insulator (SOI) substrate. The substrate 202 may be crystalline Si or poly Si. In alternative embodiments, the substrate 202 may include other elementary semiconductors such as germanium, or may include a compound semiconductor such as, silicon carbide, gallium arsenide, indium arsenide, and indium phosphide. One or more isolation features (not shown) may be formed on the substrate 202. The substrate 202 may also include one or more integrated circuit devices (not shown), such as CMOS devices, (e.g., NMOS and/or PMOS transistors). The substrate 202 may include circuitry associated with the transistors such as interconnect layers (e.g., metal lines and vias) and interlayer dielectric layers (ILD).

Figure 2:
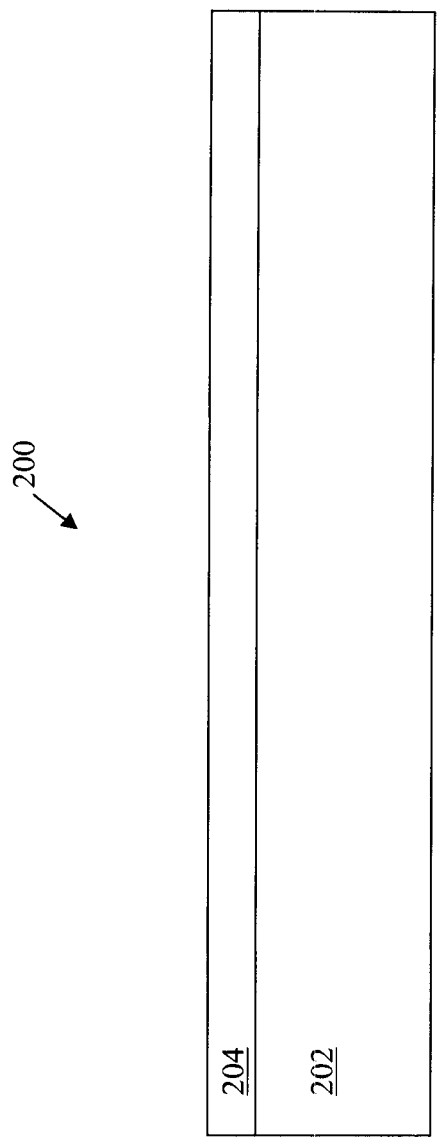
FIGS. 2-6 show cross-sectional and plan views illustrating an embodiment of a microstructure device according to the method of FIG. 1 at various stages of fabrication.

The method 100 then proceeds to block 104 where an oxide layer 204 (e.g., a buried oxide layer) is formed on the wafer substrate 202 (FIG. 2). In an embodiment, the buried oxide layer 204 is a silicon oxide (SiO2) layer having a thickness range of approximately 1 um-3 um. The buried oxide layer 204 may include a nitride layer to improve isolation. For example, in an embodiment, the oxide layer 204 may comprise SiN4/SiO2. In another embodiment, the oxide layer 204 may comprise polysilicon/SiO2. In yet another embodiment, the oxide layer 204 may comprise SiO2/polysilicon/SiO2.

Figure 3:
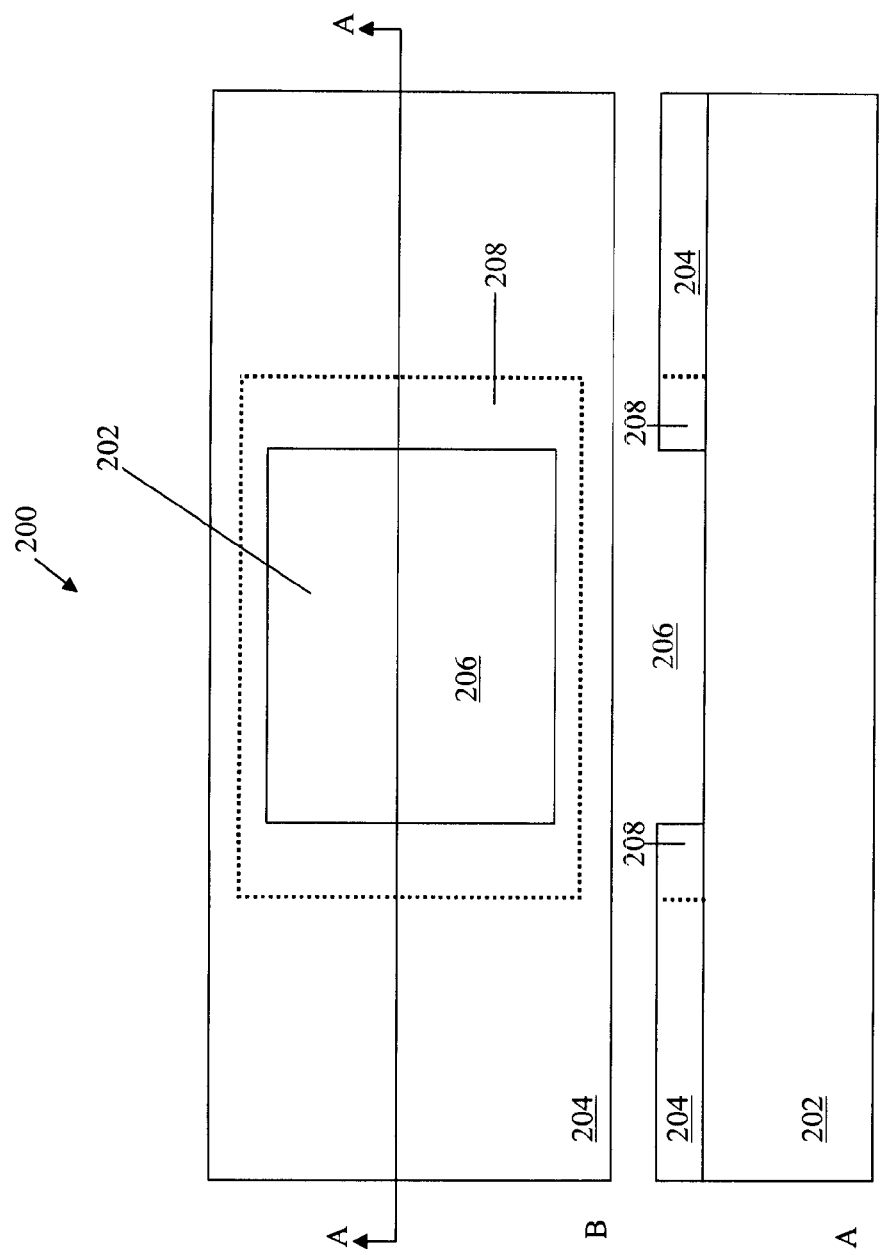

The method 100 next proceeds to block 106 where the oxide layer 204 is etched to form a patterned cavity 206 (FIG. 3 A&B) in the oxide layer 204. View B of FIG. 3 is a plan view of an embodiment of the device 200 showing a top view of the cavity 206 as an open cavity. View A of FIG. 3 is a sectional view along lines A-A of view B showing a side view of the device 200. The etching process essentially removes the oxide layer 204 down to the substrate layer 202 for the desired pattern of the cavity 206. The etching process leaves a cavity sidewall/shoulder 208 in the oxide layer 204 to support a microstructure device, as is described in more detail below. The cavity 206 is formed by patterning the oxide layer 204 to a desired pattern using a photolithography process and then performing a wet etching process or by forming a dry plasma etching process to the oxide layer 204. In an embodiment, the cavity 206 extends through the oxide layer 204 to the substrate 202, however, this is optional and the cavity 206 may not extend entirely through the oxide layer 204 and alternatively, may extend through the oxide layer 204 and part way into the substrate 202. Size dimensions for the cavity 206 may be any size to accommodate a microstructure device (e.g., a MEMS device) formed above the cavity 206, as is described below.

Figure 4:
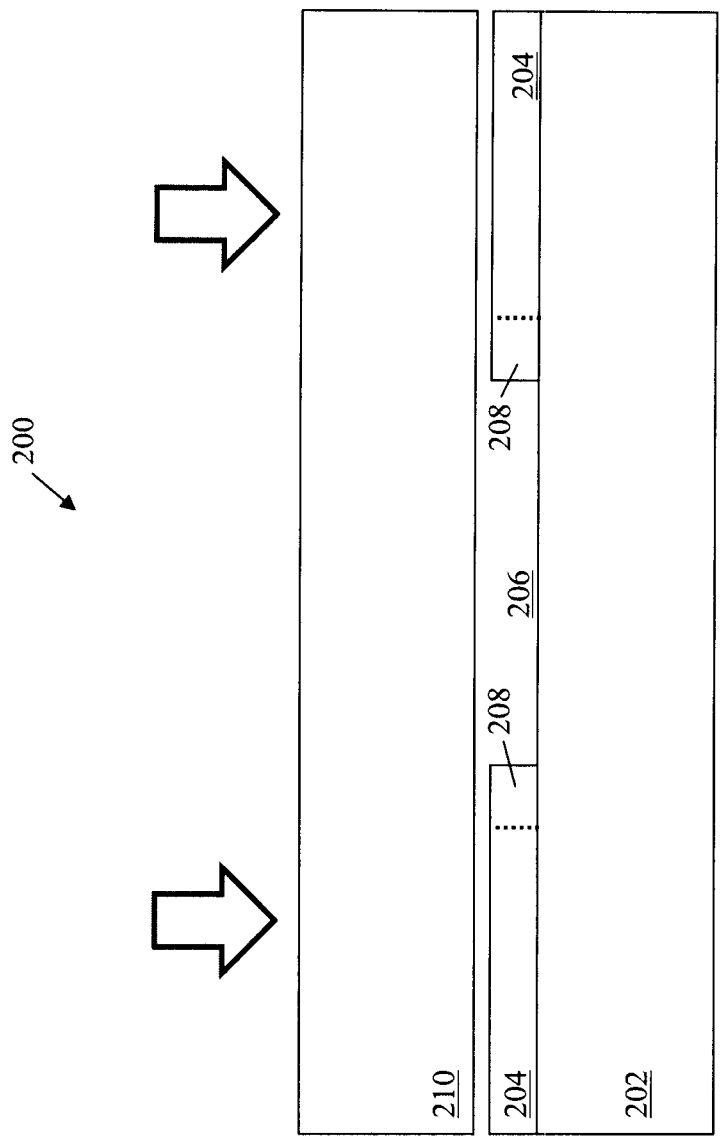

After etching the cavity 206, the method 100 proceeds to block 108 where a device layer 210 wafer is bonded to the oxide layer 204 over the cavity 206 (FIG. 4). In an embodiment, the device layer 210 is a doped silicon (Si), low resistance, substrate having a thickness range of approximately 5 um-40 um. In an embodiment, the device layer 210 has an approximate resistivity <1 Ohm-cm. In an embodiment, the device layer 210 may include a bonded silicon on insulator (SOI) substrate. The device layer 210 may be crystalline Si or poly Si. In alternative embodiments, the device layer 210 may include other elementary semiconductors such as germanium, or may include a compound semiconductor such as, silicon carbide, gallium arsenide, indium arsenide, and indium phosphide. One or more isolation features may be formed on the device layer 210. The device layer 210 may also include one or more integrated circuit devices (not shown), such as CMOS devices, (e.g., NMOS and/or PMOS transistors). The device layer 210 may include circuitry associated with the transistors such as interconnect layers (e.g., metal lines and vias) and interlayer dielectric layers (ILD).

In an embodiment, the device layer 210 is fusion bonded to the oxide layer 204. The bonding process parameters depend on metal pattern density and material properties. In an embodiment, a typical bonding temperature is approximately room temperature (e.g., 20 C) to approximately 200 C. Bonding force may be less than 5 kN and bonding time may be less than 10 minutes. However, it should be understood that other parameters may be used for the bonding.

Additionally, the method may include an optional grinding/forming process in block 108 to pre-form a microstructure device over the cavity 206. This process may shape and/or thin the device layer 210 over the cavity 206 to put the microstructure in a form for performing the intended function of the microstructure device, such as an inertia sensor, a pressure sensor, and etc. The method may also include an optional process to form a top oxide layer (e.g., SiO2) (not shown) on the device layer 210 in block 108. In an embodiment, the top oxide layer is grown on the device layer 210 using a thermal oxidation heat process. In another embodiment, the top oxide layer is deposited on the device layer 210 using a chemical vapor deposition (CVD), plasma enhanced CVD, spin-on, sputter, or other depositing process for forming dielectric layers on a substrate.

Figure 5:
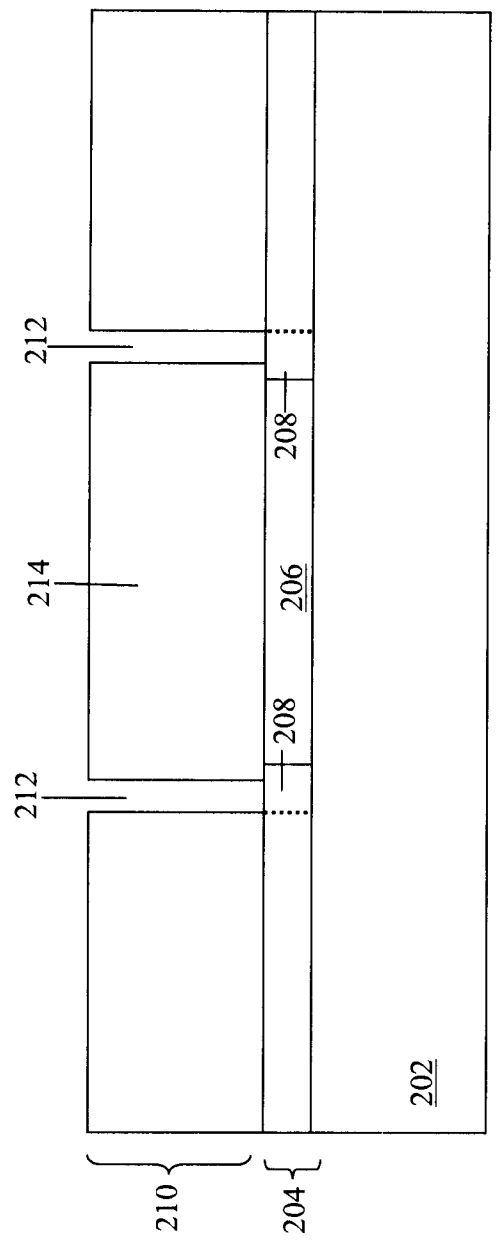

The method 100 proceeds to block 110 where the device layer 210 is etched to form a trench 212 around a perimeter of the microstructure device 214 to define outer boundaries of the microstructure device 214 (FIG. 5). In an embodiment, the etch process, includes a photolithography mask to define the desired etch pattern, such as defining the trench 212. In an embodiment, the etch process performed on the device layer includes a deep reactive ion etch (DRIE) process to etch the silicon of the device layer 210. The etching processes may include a wet etching process, a dry plasma etching process, and/or other etching processes suitable for forming trenches to define the microstructure device 214. It should be understood that a DRIE process may include an anisotropic etching process capable of forming deep holes and trenches having aspect ratios of 20:1 or more. The DRIE process may include cryogenic or Bosch etching processes. As shown in FIG. 5, the cavity sidewalls 208 extend under the microstructure device 214 and support it thereon. Thus, the outer dimensions for the cavity 206 are smaller than corresponding dimensions for the microstructure device 214. Thus, after the etching process is completed to define the trench 212, there is very little oxide layer 204 left to remove to release the microstructure device 214. As such, the etching process to remove the sidewalls 208 is a much shorter time period than conventional etch processes where a bulk film oxide layer under the entire length of the microstructure device is removed.

Figure 6:
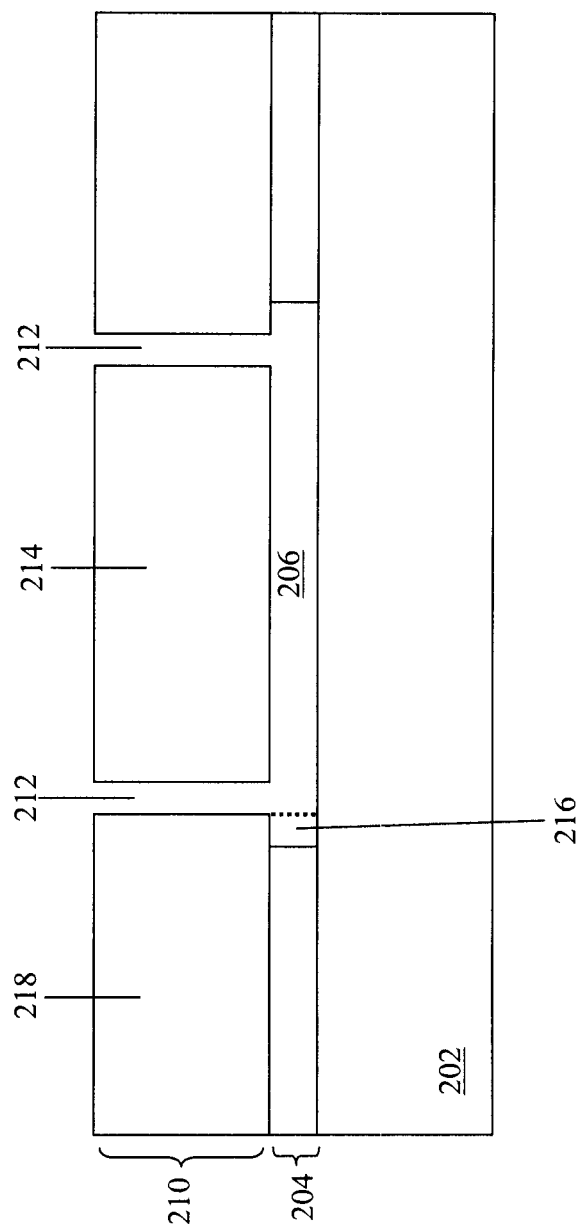

Accordingly, the method 100 proceeds to block 112 where an etch process is performed through the trench 212 to etch away the sidewalls 208 of the cavity 206 and thus, release the microstructure device 214 (FIG. 6). In an embodiment, this etching process is performed using a photolithography mask. The photolithography mask may be the same mask discussed above with respect to block 110 used to form the trenches 212. The etching processes may include a wet etching process, a dry plasma etching process, and/or other etching processes suitable for etching silicon oxide layers. After the etching process, the trenches extend down to the substrate 202. It should be understood that the etching processes of blocks 110 and 112 may be performed as a single process or multiple processes. As should be understood, the microstructure device 214 is supported by the anchor 218 and related structure three-dimensionally into or out of the device 200 (e.g., in front of and/or in back of the sectional views shown in the figures). For example support springs (not shown) may couple the microstructure 214 to the anchor 218 and allow the microstructure 214 to flex without breaking. In an embodiment, the etching includes a vapor HF etching process or an HF wet etching process. In an embodiment, a typical vapor HF etching parameters are approximately (e.g., 20 C) to approximately 100 C. Chamber pressure may be approximately 50-250 mbar. Etching time depends on device size.

As should be understood, the etch process of block 112 etches away at the oxide layer 204 substantially uniformly in all directions. Therefore, the oxide layer 204 is etched laterally along the oxide layer 204, removing the cavity sidewall 208 below the trench 212 and into the cavity 206. In addition, the etch process etches away an undercut portion 216 of the oxide layer 204 under an anchor 218 portion of the device layer 210. Because the etch process only needs to etch away the side walls 208 of the cavity, the etch process is performed during a much shorter time period than conventional microstructure fabrication processes. Therefore, the etching to the undercut area 216 of the anchor is much less using the method 100 than using conventional microstructure processes. In an embodiment, the lateral length dimension of the undercut 216 is less than half of the lateral length dimension of the microstructure device 214. In an embodiment, the cavity 206 has a size dimension of less than 1 mm×1 mm. The trench 212 may be formed to be approximately 0.2 um to approximately 10 um. In an embodiment, the microstructure device 214 has a size dimension of less than 1 mm×1 mm. The undercut 216 may be formed to be less than approximately 2 um. However, it should be understood that other dimensions may be used.

The method 100 next proceeds to block 114 where the device 200 is packaged to protect the device 200. The device 200 may also include a top cap CMOS wafer (not shown) bonded to the device 200, thereby creating a hermetically sealed package and CMOS integrated circuit device. The CMOS wafer may include a number of metal (e.g., Al, Cu, etc.) pads formed on the wafer using traditional CMOS processes. The metal pads are bonded to the device 200 using a eutectic bond process. In an embodiment, the pads electrically couple with circuitry, such as a driver circuit, on the CMOS wafer, thereby providing electrical coupling with other portions of the microstructure device 200. In addition, the CMOS wafer may include a contact pad, which couples circuitry in the device 200 outside of the device 200. The device 200 may be enclosed in a package and top cap assembly where the package is formed using a molding process and may include an epoxy coating. In an embodiment, the top cap is configured to be a printed circuit (PC) board package. The package assembly may include a wire bond coupling the contact pad to an outside contact on the top cap. As should be understood, packaging of the device 200 provides for increased protection of the device 200.

As should be readily understood, the device 200 may include a piezoelectric transducer or other MEMS type device formed into or bonded to (not shown) the microstructure device 214. In an embodiment, a transducer may include a bottom metal layer, a piezoelectric layer and a top metal layer. The metal layers may include Al, Pt, Mo, AlCu, Ti, and combinations thereof. The piezoelectric layer may include AlN, PZT, and/or ZnO. However, other materials may be used for the metal layers and the piezoelectric layers. The transducer may be fabricated on or otherwise bonded to the microstructure device 214 before the oxide release below the microstructure device 212 described in block 112. The layers of the piezoelectric transducer may be formed using a sputter deposition or other process. The usefulness of the device 200 described above with respect to method 100 should be readily understood by those having ordinary skill in the art.

FIGS. 7-10 show cross-sectional and plan views illustrating an embodiment of another microstructure device 300 according to the method 100 at various stages of fabrication. The devices shown in FIGS. 7-10 described below may be fabricated, in part, using the method 100 and may have features substantially similar to that of device 200. Accordingly, features and processes, which are similar to those described for device 200 are not duplicated here for simplicity.

Figure 7:
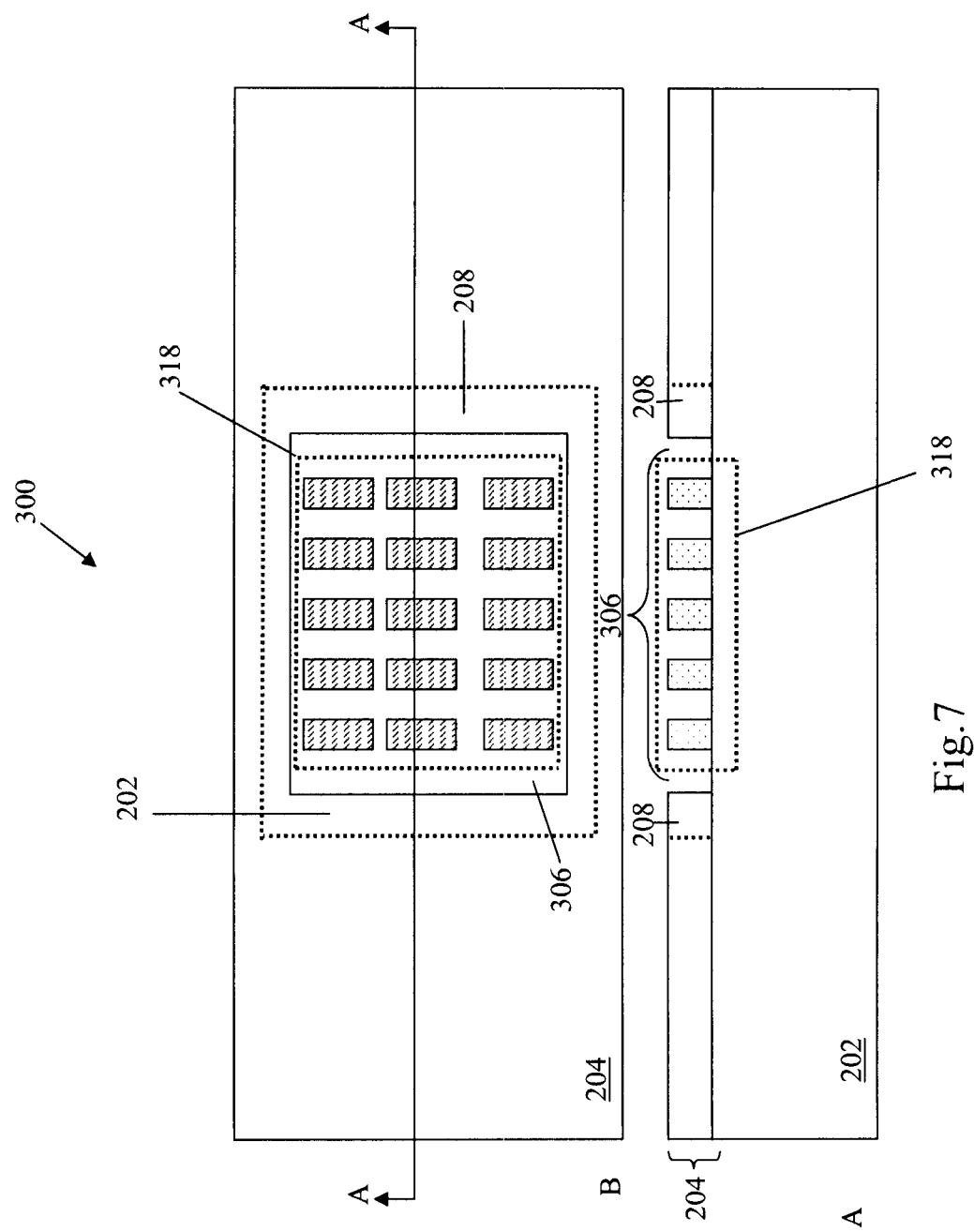
FIGS. 7-10 show cross-sectional and plan views illustrating an embodiment of another microstructure device according to the method of FIG. 1 at various stages of fabrication.

FIG. 7 shows an alternative microstructure device 300 having an improved anchor and relates to block 106 of method 100 where the oxide layer 204 is etched to form a patterned cavity 306 (FIG. 7 A&B) in the oxide layer 204 having a plurality of pillars 318. View B of FIG. 7 is a plan view of an embodiment of the device 300 showing a top view of the cavity 306 having the plurality of pillars 318 formed in the cavity 306. View A of FIG. 7 is a sectional view along lines A-A of view B showing a side view of the device 300. The etching process essentially removes the oxide layer 204 down to the substrate layer 202 for the desired pattern of the cavity 306. The etching process leaves a cavity sidewall/shoulder 208 in the oxide layer 204 to support a microstructure device 214. The cavity 306 is formed by patterning the oxide layer 204 to a desired pattern using a photolithography process and then performing a wet etching process or by forming a dry plasma etching process to the oxide layer 204. In an embodiment, the cavity 306 extends through the oxide layer 204 to the substrate 202, however, this is optional and the cavity 306 may not extend entirely through the oxide layer 204 and alternatively, may extend through the oxide layer 204 and part way into the substrate 202. Size dimensions for the cavity 306 may be any size to accommodate a microstructure device (e.g., a MEMS device) formed above the cavity 306. In an embodiment, the pillars 318 have dimensions of approximately 0.5 um to approximately 4 um. However, other sizes of pillars may be used.

Figure 8:
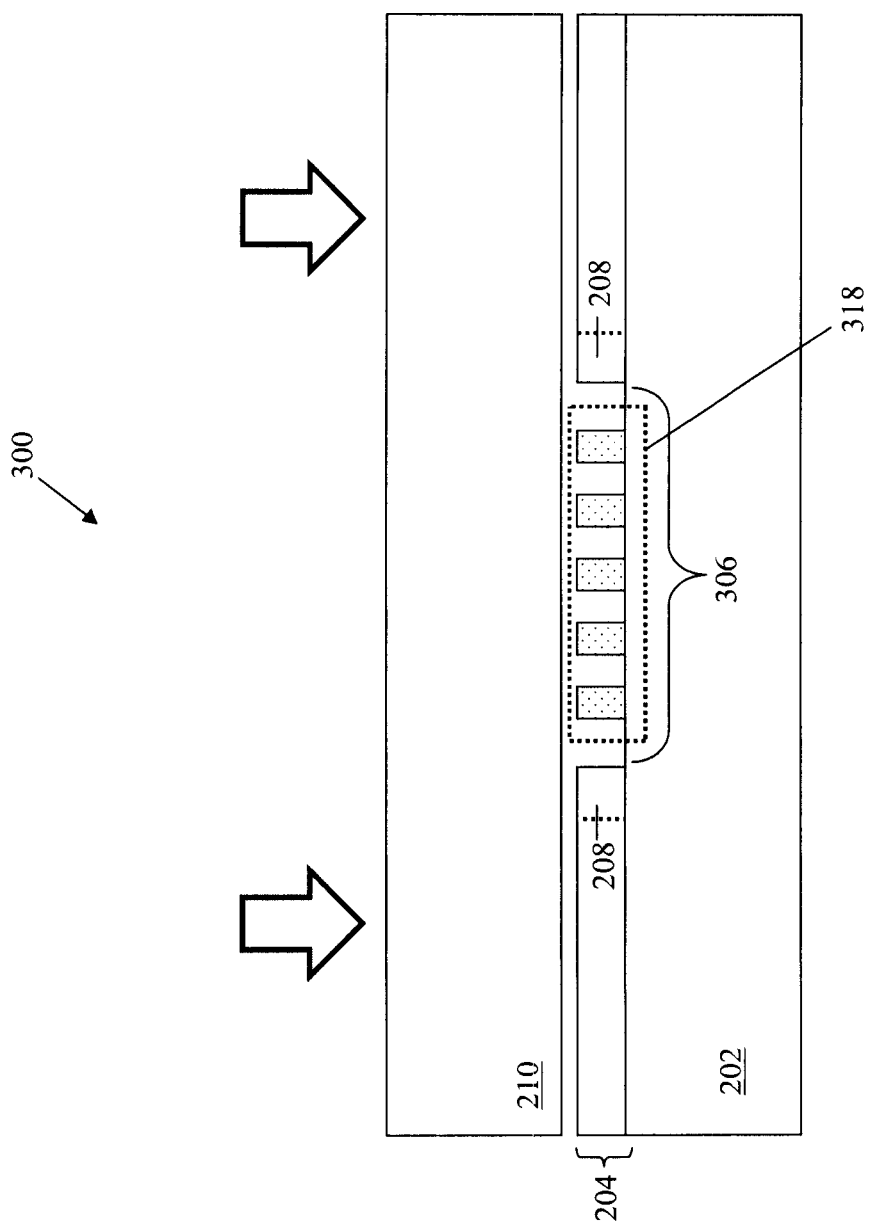

FIG. 8 shows the microstructure device 300 and relates to block 108 of method 100 where the device layer 210 wafer is bonded to the oxide layer 204 (and the pillars 318) over the cavity 306. As should be understood, the plurality of pillars provides a greater bonding strength for bonding the device layer 210 to the device 300. The bonding process is substantially similar to that discussed above with respect to device 200 in block 108.

Figure 9:
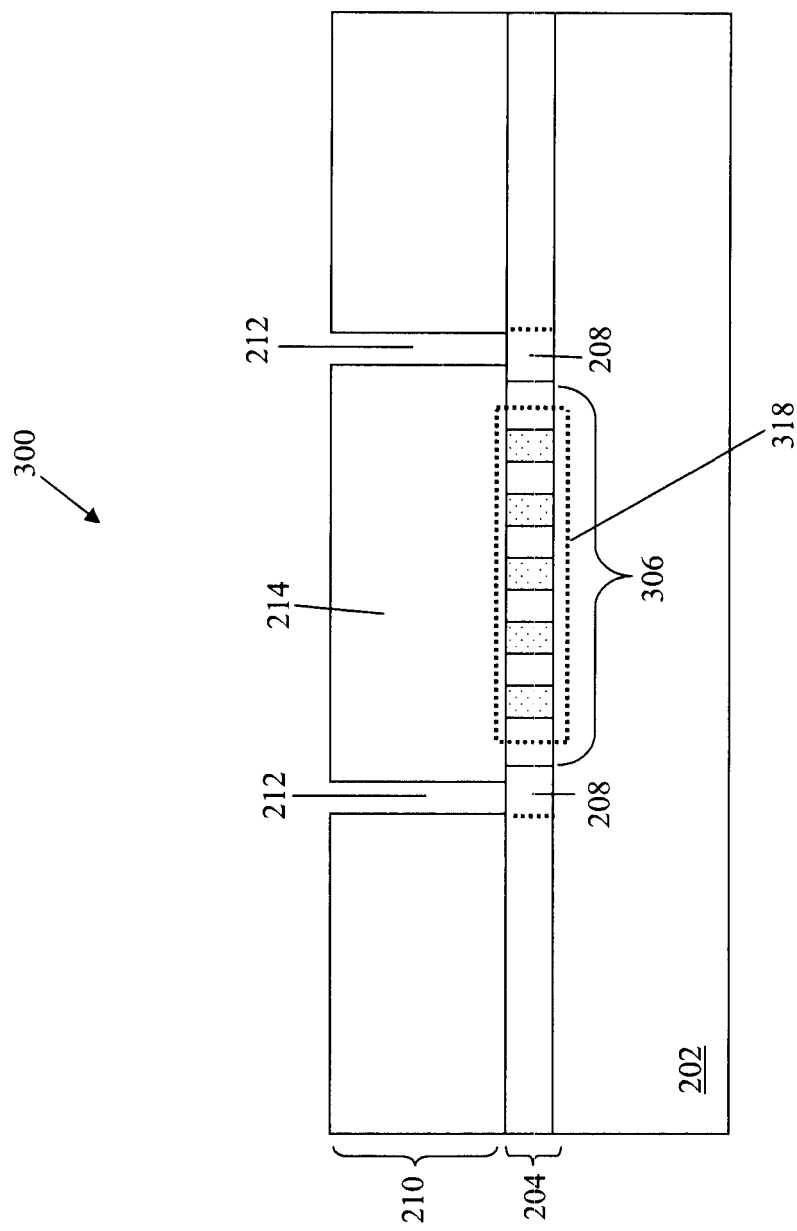

FIG. 9 shows the microstructure device 300 and relates to block 110 of method 100 where the device layer 210 is etched to form a trench 212 around a perimeter of the microstructure device 214 to define outer boundaries of the microstructure device 214. The etching process is substantially similar to that discussed above with respect to device 200 in block 110.

Figure 10:
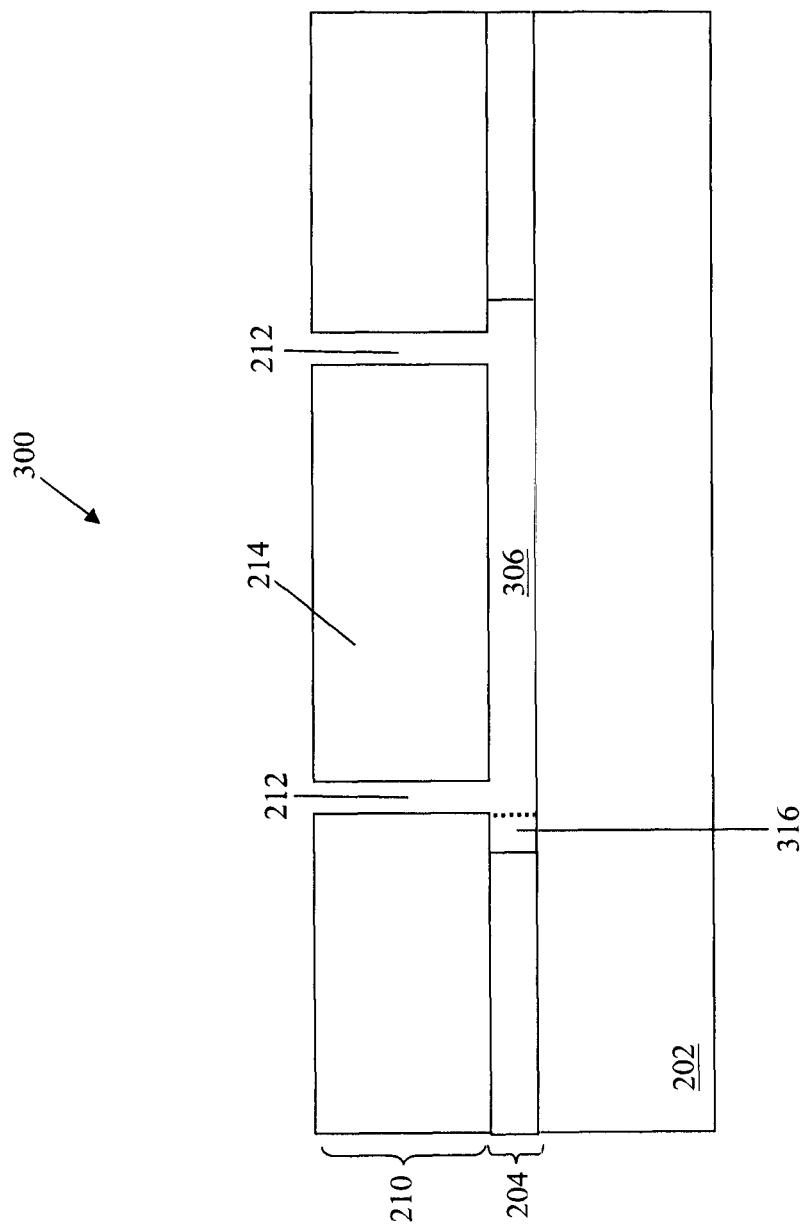

FIG. 10 shows the microstructure device 300 and relates to block 112 of method 100 where an etch process is performed through the trench 212 to etch away the sidewalls 208 of the cavity 306 and the pillars 318, and thus, release the microstructure device 214. The etching process is substantially similar to that discussed above with respect to device 200 in block 112. However, it should be understood that the etch process to release the microstructure device 214 may need to be performed for a time period that is longer than that for device 200 in order to have time to etch away the pillars 318 in the cavity 306. Accordingly, the undercut 316 may be proportionately longer than the undercut 216 for device 200. However, the undercut 316 should still be smaller than that for conventional microstructure devices fabricated using conventional fabrication processes.

As should be understood the microstructure 212 may be formed as a MEMS device, in whole or in part. The MEMS device may include a plurality of elements formed on metal, polysilicon, dielectric, and/or other materials. The MEMS device may include materials typically used in a conventional CMOS fabrication process. Any configuration of MEMS device may be possible, depending on the desired functionality. One or more of the elements depicted may be designed to provide MEMS mechanical structures of the MEMS device. The MEMS mechanical structures may include structures or elements operable for mechanical movement. The MEMS device may be formed using typical processes used in CMOS fabrication, for example, photolithography, etching processes (e.g., wet etch, dry etch, plasma etch), deposition processes, plating processes, and/or other suitable processes. In an embodiment, the MEMS device may be a motion sensor (e.g., a gyroscope, an accelerometer, etc.), a radio frequency (RF) MEMS device (e.g., an RF switch, filter, etc.), an oscillator, or any other MEMS type device. Various sizes of MEMS devices are contemplated.

The MEMS device may be configured to interact with outside perturbation, such as temperature variation, inertial movement, pressure changes, and/or other electrical, magnetic, or optical parameter measurements. For example, in an embodiment, when the devices of the present disclosure are exposed to a pressure change, the MEMS device microstructure 214 will deform inward or outward and thus, a sensing signal will be created to indicate a pressure change. It is noted that the portions of the CMOS wafer may include one or more circuit devices (not shown), such as transistors (e.g., NMOS and/or PMOS transistors). The CMOS wafer may also include circuitry associated with the transistors, such as interconnect layers (e.g., metal lines and vias) and interlayer dielectric layers (ILD). As should be understood, conductors on the device 200 may be mounted directly onto a printed circuit board (PCB) using surface-mount or other technology processes.

The present disclosure provides for many different embodiments. In one embodiment, the present disclosure describes a system of fabricating a microstructure device with an improved anchor. A method of fabricating a microstructure device with an improved anchor includes providing a substrate and forming an oxide layer on the substrate. Then, a cavity is etched in the oxide layer, such that the cavity includes a sidewall in the oxide layer. A microstructure device layer is then bonded to the oxide layer over the cavity. Forming a microstructure device, a trench is etched in the device layer to define an outer boundary of the microstructure device. In an embodiment, the outer boundary is substantially outside of the sidewall of the cavity. Then, the sidewall of the cavity is etched away through the trench in the device layer, to thereby suspend the microstructure device over the cavity.

In another embodiment, the present disclosure provides a method of fabricating a microstructure device. The method includes providing a substrate and forming an oxide layer on the substrate. After forming the oxide layer, the method includes etching a patterned cavity in the oxide layer by forming a photoresist pattern on the oxide layer. The pattern defines a sidewall around a perimeter of the cavity and a plurality of pillars within the cavity. The pillars remain in the cavity after the etching of the patterned cavity. The method then includes bonding a microstructure device layer to the oxide layer and the plurality of pillars, over the patterned cavity. After the microstructure device layer is bonded, the method includes etching a trench in the device layer to define an outer boundary of a microstructure device. In an embodiment, the outer boundary is outside of the sidewall of the cavity. Then, the method includes etching away the sidewall of the cavity and the plurality of pillars through the trench in the device layer, creating an open cavity, thereby suspending the microstructure device over the open cavity.

As an example, yet another embodiment of the present disclosure provides a microelectromechanical system (MEMS) device having an improved anchor. The device includes a substrate, and an oxide layer formed on the substrate, a cavity etched in the oxide layer. The device further includes a microstructure device layer bonded to the oxide layer, over the cavity. The microstructure device layer includes a substantially solid microstructure MEMS device formed in the microstructure device layer and is suspended over a portion of the cavity. An anchor is formed in the device layer and is configured to support the microstructure device, the anchor has an undercut in the oxide layer. In an embodiment, the undercut has a length along the anchor that is less than one-half a length of an outer boundary dimension of the microstructure MEMS device.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A microelectromechanical system (MEMS) device comprising:
   a substrate;
   an oxide layer formed on the substrate;
   a cavity etched in the oxide layer, the cavity having opposing sidewall portions;
   a microstructure device layer bonded to the oxide layer, over the cavity, the microstructure device layer including a substantially solid microstructure MEMS device formed in the microstructure device layer and suspended over a portion of the cavity, wherein the substantially solid microstructure MEMS device extends between the opposing sidewall portions of the cavity such that that no other MEMS device is between the substantially solid microstructure MEMS device and the sidewall portions of the cavity, wherein the substantially solid microstructure MEMS device is without release holes through the substantially solid microstructure MEMS device;
   a trench extending through the microstructure device layer around an outer boundary dimension of the substantially solid microstructure MEMS device; and
   an anchor formed in the device layer and configured to support the microstructure device, the anchor having an undercut in the oxide layer, the undercut having a length along the anchor that is less than one-half a length of the outer boundary dimension of the substantially solid microstructure MEMS device.

2. The device of claim 1, wherein the oxide layer comprises silicon oxide.

3. The device of claim 1, further comprising a package hermetically sealing the device from outside elements.

4. The device of claim 1, wherein the MEMS device is configured as an accelerometer.

5. The device of claim 1, wherein the MEMS device is configured as a gyroscope.

6. The device of claim 1, wherein the MEMS device is configured as a piezoelectric resonator.

7. A microstructure device with an improved anchor, comprising:
   a substrate;
   an oxide layer on the substrate, the oxide layer including a cavity having opposing sidewall portions;
   a microstructure device over the cavity, but with an outer boundary that is outside of a sidewall of the cavity, wherein the microstructure device includes a microelectromechanical system (MEMS) device suspended over the cavity, wherein the MEMS device extends between the opposing sidewall portions of the cavity such that that no other MEMS device is between the MEMS device and the opposing sidewall portions of the cavity, wherein the MEMS device is without release holes through the MEMS device;
   a trench extending through the microstructure device around an outer boundary of the MEMS device; and
   a coupling mechanism formed in a layer also used for the microstructure device, the coupling mechanism configured to support the microstructure device, the coupling mechanism having an undercut in the oxide layer.

8. The device of claim 7, wherein the undercut has a length along the coupling mechanism that is less than one-half a length of outer of the MEMS device.

9. The device of claim 7, wherein the MEMS device is one of an accelerometer, gyroscope, and piezoelectric resonator.

10. The device of claim 7, wherein the oxide layer is a silicon oxide layer.

11. The device of claim 10, further comprising a nitride layer adjacent the silicon oxide layer.

12. The device of claim 10, further comprising a hermetically sealing member over the microstructure device, opposite to the substrate.

13. A microstructure device, comprising:
    a substrate;
    an oxide layer on the substrate;
    a patterned cavity etched in the oxide layer, including opposing sidewall portions around a perimeter of the cavity; and
    a microstructure device over the patterned cavity, wherein the microstructure device includes a microelectromechanical system (MEMS) device suspended over the cavity, wherein the MEMS device extends between the opposing sidewall portions of the cavity such that that no other MEMS device is between the MEMS device and the opposing sidewall portions of the cavity, wherein the MEMS device is without release holes through the MEMS device.

14. The device of claim 13, further comprising an anchor to support the microstructure device.

15. The device of claim 14, wherein the cavity includes an undercut below the anchor, the undercut being formed to have a length along the anchor that is less than one-half a length of an outer boundary of the MEMS device.

16. The device of claim 13, wherein the MEMS device is one of an accelerometer, gyroscope, and piezoelectric resonator.

17. The device of claim 13, wherein the oxide layer on the substrate includes silicon oxide.

18. The device of claim 13, further comprising a hermetic seal opposite to the substrate.

19. The device of claim 13, further comprising a package hermetically sealing the device from outside elements.

20. The device of claim 13, further comprising a trench extending through the microstructure device around an outer boundary of the MEMS device.

* * * * *